United States Patent

Chaki et al.

[11] Patent Number: 6,043,713
[45] Date of Patent: Mar. 28, 2000

[54] AMPLIFIER WITH TEMPERATURE COMPENSATION FUNCTION

[75] Inventors: Shin Chaki; Yasuharu Nakajima, both of Tokyo, Japan

[73] Assignee: Mitsuhishi Denki Kabushiki Kaisha, Tokyo, Japan

[21] Appl. No.: 09/100,751

[22] Filed: Jun. 22, 1998

[30] Foreign Application Priority Data

Jan. 5, 1998 [JP] Japan .................................. 10-000509

[51] Int. Cl.[7] ...................................................... H03F 3/04
[52] U.S. Cl. .......................................... 330/289; 330/311
[58] Field of Search .................................... 330/289, 284, 330/311, 144, 145

[56] References Cited

U.S. PATENT DOCUMENTS 4,485,349  11/1984  Siegel et al. ................................ 330/3
4,992,753  2/1991  Jenson et al. ............................ 330/129
5,132,632  7/1992  Russell et al. ............................. 328/16

FOREIGN PATENT DOCUMENTS 19710769  3/1997  Germany .
9139630  5/1997  Japan .

Primary Examiner—Robert Pascal
Assistant Examiner—Henry Choe
Attorney, Agent, or Firm—Leydig, Voit & Mayer, Ltd.

[57] ABSTRACT

An amplifier with a temperature compensation function featuring a simple configuration wherein a high frequency signal attenuation circuit is connected to a gate terminal of an amplifying active device. The high frequency signal attenuation circuit uses the source terminal and the drain terminal of a compensating active device as input and output terminals, and the gate terminal is grounded.

9 Claims, 10 Drawing Sheets

AMPLIFIER WITH TEMPERATURE COMPENSATION FUNCTION

BACKGROUND OF THE INVENTION

1. Field of the Invention

The present invention relates to an amplifier for amplifying signals in the microwave and milliwave frequency bands, and relates particularly to an amplifier having a function for compensating variations in amplifier gain resulting from changes in amplifier temperature.

2. Description of the Prior Art

The gain of microwave and milliwave amplifiers and amplifier modules comprising such amplifiers tends to vary with the environmental temperature in which the amplifier or amplifier module is used. More particularly, the gain of such an amplifier or amplifier module tends to rise when the environmental temperature drops, and to drop when the environmental temperature rises. The range of this change is particularly pronounced in multiple stage amplifiers, and in cases can interfere with stable operation of the overall system.

For example, in a power amplifier module comprising three two-stage amplifier MMIC devices with different outputs in series, a 100° C. change in the environmental temperature results in a 12 dB change in gain if the temperature-dependent gain change per amplifier stage is 2 dB/10° C. The distortion characteristic of such a power amplifier module thus deteriorates when the environmental temperature is low and gain is greatest. Loss of power and efficiency are also potential problems when the environmental temperature is high and gain is low.

To compensate for such changes in gain resulting from temperature variations, a temperature compensation circuit can be connected in series with the gate terminal of an amplification FET for directly controlling an applied bias voltage. This temperature compensation circuit compensates for a drop in the operating current of the amplifier resulting from a rise in temperature by supplying an appropriate current to the gate. The internal operating current of the amplifier is thus held to a constant level within a specified operating temperature range.

A drawback to the above-noted conventional temperature compensation circuit is that a separate external power supply is needed to supply the required bias voltage to the gain control terminal, that is, the gate of the amplification FET. It is also necessary to measure the temperature characteristics of amplifier gain to predetermine the bias required at a particular temperature, and provide in the amplifier system or module a further mechanism for actually applying this information during system or module operation. This complicates circuit design and configuration, and thus leads to increased cost.

A power amplification apparatus capable of temperature compensation without having a temperature compensation circuit as described above is described in Japanese Patent Laid-Open Publication No. 9-139630. This power amplification apparatus is formed on a GaAs substrate, and comprises an amplification FET for amplifying a high frequency power supply, and a self-biased gate bias circuit in series with a resistor and a temperature compensation FET formed on a GaAs substrate. One terminal of the gate bias circuit is connected to a power supply, and the other to ground. To exhibit opposite temperature characteristics, the gate orientation of the amplification FET is set at 90°, and the gate orientation of the temperature compensation FET is set at 0°, relative to the orientation flat of the GaAs substrate.

As the environmental temperature rises and the operating current of the amplification FET drops, the operating current of the temperature compensation FET rises. On the other hand, when the environmental temperature drops and the operating current of the amplification FET rises, the operating current of the temperature compensation FET drops.

With the power amplification apparatus described above, a temperature compensation FET with the above-noted temperature characteristic is used as a resistor, and is connected in series with a normal resistor to form a gate bias series circuit. Using resistance division, this gate bias series circuit works to stabilize the power amplification apparatus output by suppressing changes in the amplification factor in response to temperature changes.

Process control can be expected to become difficult, however, when FETs with significantly different characteristics are formed on a single wafer to achieve a power amplification apparatus as described above, with particular performance characteristics.

SUMMARY OF THE INVENTION

Therefore, an object of the present invention is to provide an amplifier having a temperature compensation function in a configuration simpler than that described above.

To achieve the above object, an amplifier with a temperature compensation function according to the present invention comprises an amplifier being comprised of a first active device for amplifying a high frequency signal and an attenuation circuit being comprised of a second active device for attenuating the high frequency signal to be input to said amplifier, wherein said attenuation circuit varies an amount of attenuation of the high frequency signal input to said amplifier depending on a change in temperature of said amplifier circuit, thereby compensating a temperature drift of said amplifier.

With this attenuation circuit, a rise in the environmental temperature results in low loss, and a stronger high frequency signal can be supplied to the active device for amplification. Conversely, a drop in the environmental temperature results in greater loss, and the high frequency signal level supplied to the first active device for amplification drops. This operation of the attenuation circuit can thus appropriately compensate for a drop or rise in the gain of the first active devices used for amplification accompanying a rise or drop in the environmental temperature.

It should be noted that the gate terminal of the second active device for temperature compensation can be connected to the gate terminal of the first active device for amplification. By thus using a common gate terminal for the first and second active devices for both amplification and temperature compensation, high frequency signal loss at a particular temperature (for example, $T=T_o$) in the attenuation circuit can be kept constant irrespective of the bias conditions under which the first active device for amplification is used. This makes it possible to achieve a more stable temperature compensation function.

In addition, when the gate terminal of the second active device for temperature compensation is connected to the gate terminal of the first active device for amplification, the gate terminal of the second active device for temperature compensation can be connected to ground through a resistor, preferably through a variable resistor. With this configuration, the gate potential of the second active device for temperature compensation can be set to a value within a specific range to thereby achieve more appropriate temperature compensation. If a variable resistor is used, individual differences in amplifiers can be corrected after the amplifiers are manufactured.

In an alternative embodiment of an amplifier with a temperature compensation function according to the present invention, a high frequency attenuation circuit having first and second resistors is connected with a gate terminal of a first active device for amplification. The first resistor, of which one terminal is connected to a power supply terminal, is connected to a gate terminal of a second active device for temperature compensation, and the second resistor, of which one terminal is connected to ground, is connected to the gate terminal of the second active device.

Using an attenuation circuit thus comprised, a desired bias level can be applied to the second active device for temperature compensation. While this amplifier requires a separate power supply, it does not require a special control circuit for controlling the gain of the first active device for amplification. It should be noted that the second resistor in this configuration is also preferably a variable resistor for the reasons described above.

In a further alternative embodiment of an amplifier with a temperature compensation function according to the present invention, a high frequency attenuation circuit is connected with an output terminal of a first active device for amplification where the high frequency attenuation circuit uses the source and drain terminals of a second active device for temperature compensation as the input and output terminals of the second active device for temperature compensation. In this case, a change in the gain of the first active device for amplification accompanying a change in environmental temperature can be compensated on the output terminal side. An increase in the device size can be minimized in this case by designing the first active device for amplification and the second active device for temperature compensation to use a common ground terminal. In addition, if the first active device for amplification and the second active device for temperature compensation are proximal, these two devices can be treated as one during design and development, thereby simplifying such design-related tasks as design parameter evaluation.

In any case, the circuit can also be designed such that a pair of active devices for temperature compensation arranged symmetrically to the main line of a first active device for amplification, and the first active device for amplification, have a common ground terminal, thereby eliminating unbalanced operation in the millimeterwave range at the input terminal of the first active device for amplification.

It should be noted that the present invention also relates to a multistage amplifier, which is an amplifier comprising a plurality of consecutively connected stages, where at least the amplifier used as the first stage is an amplifier with a temperature compensation function as described above. It should be further noted that using an amplifier with a temperature compensation function according to the present invention in such a multistage amplifier suppresses any increase in the device size.

It should be yet further noted that an amplifier according to the present invention can be effectively used when an amplifier with a temperature compensation function cannot be used at every amplification stage due to device size limitations, when specifications do not require a circuit achieving a temperature compensation function at each stage, and when there is sufficient tolerance at the power supply connection with an amplifier provided downstream, and the amplitude of the input high frequency signal is low.

Other objects and attainments together with a fuller understanding of the invention will become apparent and appreciated by referring to the following description and claims taken in conjunction with the accompanying drawings.

DETAILED DESCRIPTION OF THE EMBODIMENTS

An amplifier with a temperature compensation function according to the present invention is an amplifier for a microwave or milliwave frequency band. The amplifier comprises a high frequency signal attenuation circuit that uses a change in resistance resulting from a change in the environmental temperature of an FET (field effect transistor) or HEMT (high electron mobility transistor) active device for temperature compensation at a specific frequency band (high frequency band). The attenuation circuit is connected in series with a gate terminal or output terminal of an active device for amplification to compensate, without relying on any special external control means, gain variations accompanying changes in the environmental temperature of the active device for amplification.

Preferred embodiments 1 through 10 of an amplifier with a temperature compensation function according to the present invention are described in detail below with reference to the accompanying figures.

Embodiment 1

Figure 1:
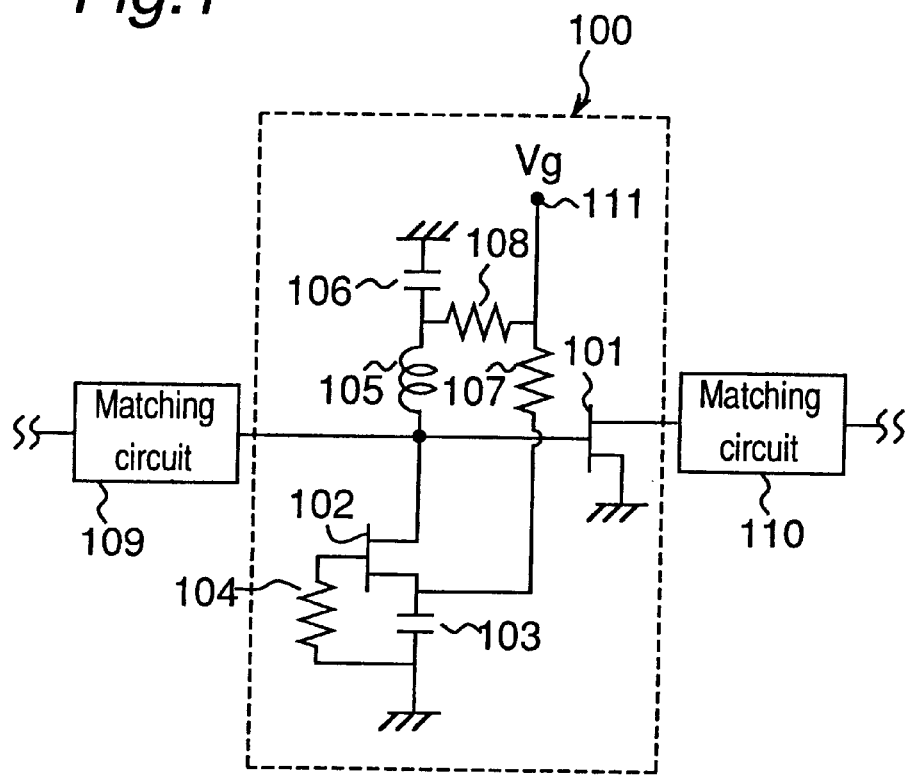
FIG. 1 is a circuit diagram of an amplifier with a temperature compensation function according to a first embodiment of the present invention.

FIG. 1 is a circuit diagram of an amplifier 100 with a temperature compensation function according to a first embodiment of the present invention. A matching circuit 109 for converting the impedance of a high frequency power supply to an impedance appropriate for the amplifier 100 is provided before the amplifier 100. A further matching circuit 110 provided after the amplifier 100 matches the impedance of the amplified high frequency output from the amplifier 100 to the impedance of the downstream circuits.

The configuration of the amplifier 100 is described next.

As shown in FIG. 1, the amplifier 100 comprises a circuit for implementing a temperature compensation function connected in series with the gate of an active device 101 for signal amplification. A device such as an FET or HEMT is used as the active device 102 for temperature compensation and the active device 101 for amplification.

The circuit achieving the temperature compensation function comprises an inductor 105 and resistors 107 and 108 connected in series with the source terminal and drain terminal of the active device 102 for temperature compensation, the gate of which is connected to ground via resistor 104. This circuit operates as a high frequency signal attenuation circuit. Capacitors 103 and 106 are connected parallel to this temperature compensation circuit. Power supply voltage $V_g$ is applied to terminal 111. If the gate potential of active device 101 is $V_g$ in this circuit, the gate potential of active device 102 is $-V_g$ to the source-drain potential.

Figure 2:
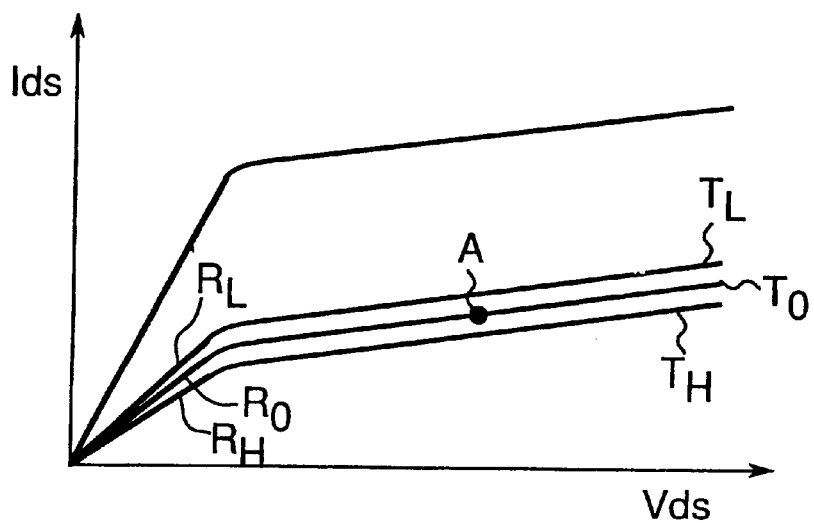
FIG. 2 is a graph of the static characteristics of an active device.

FIG. 2 is a graph of the static characteristic of active devices 101 and 102. The drain-source current Ids is shown on the vertical axis, and the drain-source voltage Vds is shown on the horizontal axis. If point A in the graph is the operating point of the amplifier at base environmental temperature $T_o$, the drain-source current Ids drops when the temperature rises to $T_H$, and rises when the temperature drops to $T_L$. That is, the gain of active devices 101 and 102 drops when the temperature rises to $T_H$, and rises when the temperature drops to $T_L$.

The temperature compensation function of this amplifier 100 uses the resistance characteristic of the active device 102 near the Vds=0 V region of the static characteristic described with reference to FIG. 2. If $R_o$ is the resistance when the environmental temperature is $T_o$, $R_H$ is the resistance when the environmental temperature is $T_H$, $R_L$ is the resistance when the environmental temperature is $T_L$, the relationship between these resistance values is $R_L < R_o < R_H$.

As will be described below, a circuit containing the above-noted active device 102 used for temperature compensation functions as a high frequency signal attenuator in which pass loss decreases as the environmental temperature increases. As the environmental temperature rises, high frequency signal pass loss in the active device 102 drops, and the high frequency signal level applied to the gate of the active device 101 for amplification rises. On the other hand, as the environmental temperature drops, high frequency signal pass loss in active device 102 rises, and the high frequency signal level applied to the gate of the active device 101 for amplification drops. As a result, changes in gain accompanying a change in the environmental temperature of the active device 101 for amplification are compensated in an amplifier 100 according to the present invention by means of a circuit containing active device 102 for temperature compensation operating as an attenuator.

The temperature compensation function of the above amplifier 100 is described in further detail below. To simplify the following description, the amplifier 100 shown in FIG. 1 is shown separated into two functionally discrete circuit devices in FIG. 3A and FIG. 3B. Note, further, that circuits not contributing to the temperature compensation function are omitted on both sides of the shown circuit devices. In addition, active device 102 for temperature compensation is shown in FIG. 3B as resistor R because in amplifier 100 a voltage exceeding pinchoff voltage $V_P$ is applied to the gate terminal so that active device 102 effectively functions as a resistor.

Figure 3A:
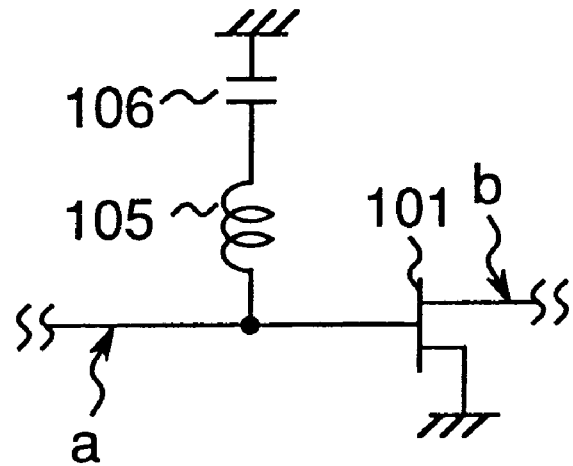
FIGS. 3A and 3B are circuit diagrams used to illustrate the functional circuit devices of the amplifier with a temperature compensation function according to the first embodiment of the invention.

In the circuit shown in FIG. 3A, a current supplied from a point a is amplified by active device 101 for amplification, and is output from point b. In general, the temperature characteristic of gain in the circuit shown in FIG. 3A tends to drop as the temperature rises, as described above.

Figure 3B:
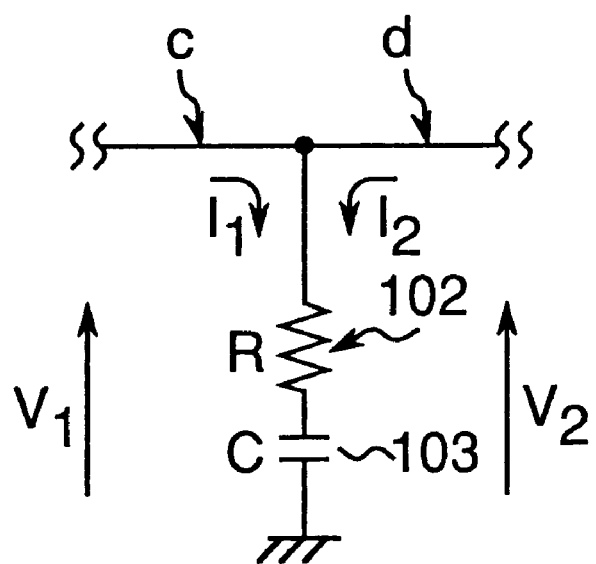

In the circuit shown in FIG. 3B, a high frequency signal input from point c passes the circuit with signal loss resulting from capacitor 103 and resistor R, which is labelled with reference number 102, and is output from point d. While described in further detail below, it should be noted that loss accompanying a temperature rise is low with the circuit shown in FIG. 3B, and the current output to point d increases.

The impedance matrix Z of the circuit shown in FIG. 3B can be expressed by equation 1 below.

$$Z = \begin{pmatrix} Z_{11} & Z_{12} \\ Z_{21} & Z_{22} \end{pmatrix} = \left(R - j\frac{1}{\omega c}\right)\begin{pmatrix} 1 & 1 \\ 1 & 1 \end{pmatrix} \quad (1)$$

The following equation 2 can be derived by converting matrix Z of equation 1 above to matrix S where $1/\omega c \approx 0$.

$$S_{21} = \frac{1}{\left(\frac{R}{Z_0}+1\right)\left(\frac{R}{Z_0}+1\right) - \frac{R^2}{Z_0^2}} \times 2 \times \frac{R}{Z_0} \quad (2)$$
$$= 2\frac{R}{2R+Z_0}$$

Equation 3 below can then be obtained by differentiating equation 2 by resistance R. As a result, circuit loss is understood to decline as the value of resistance R increases.

$$dS_{21}/dR = 2Z_0/(2R+Z_0)^2 > 0 \quad (3)$$

As described above, active device 102 is treated as a resistor R in amplifier 100. As described with reference to FIG. 2, the resistance of active device 102 increases as the environmental temperature rises. Therefore, the circuit shown in FIG. 3B operates with low loss when the temperature rises, and therefore outputs more current from point d. The amplifier 100 can therefore compensate for a change in the gain of signal-amplification active device 101 resulting from a change in environmental temperature as a result of the circuit shown in FIG. 3B operating as an attenuator.

Figure 4:
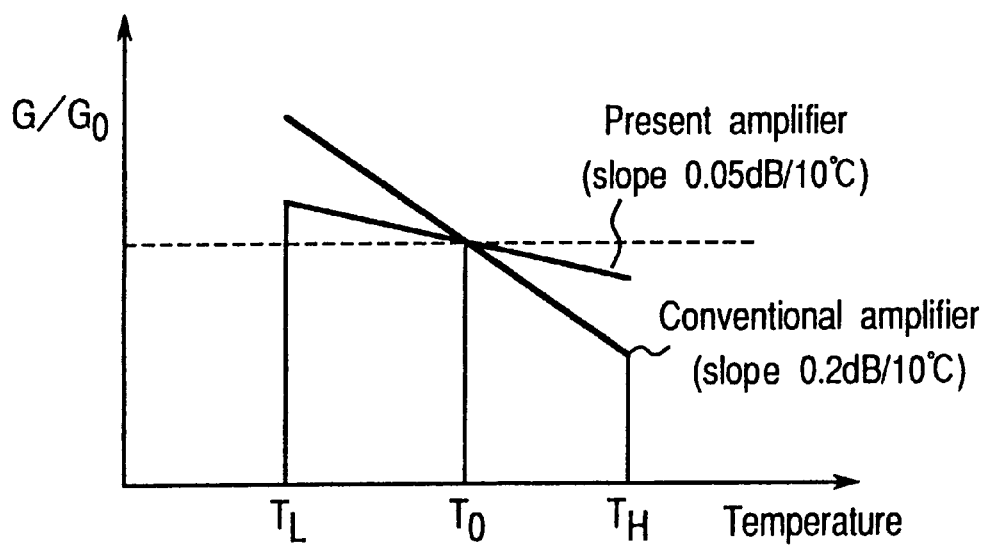
FIG. 4 is a graph of the change in gain relative to change in environmental temperature in a conventional amplifier and an amplifier with a temperature compensation function according to the first embodiment of the present invention.

FIG. 4 is a graph referenced below to describe the effect of an amplifier 100 with a temperature compensation function as shown in FIG. 1.

Referring to FIG. 4, the ratio $G/G_o$ of gain to the gain $G_o$ when $T=T_o$ is shown on the vertical axis, and temperature is shown on the horizontal axis. As will be known from the figure, the slope (0.05 dB/10° C.) of the change in gain relative to the temperature of the amplifier 100 with a temperature compensation function is less than the slope (0.2 dB/10° C.) of the change in gain relative to the temperature of a conventional amplifier not comprising a temperature compensation function.

Figure 5:
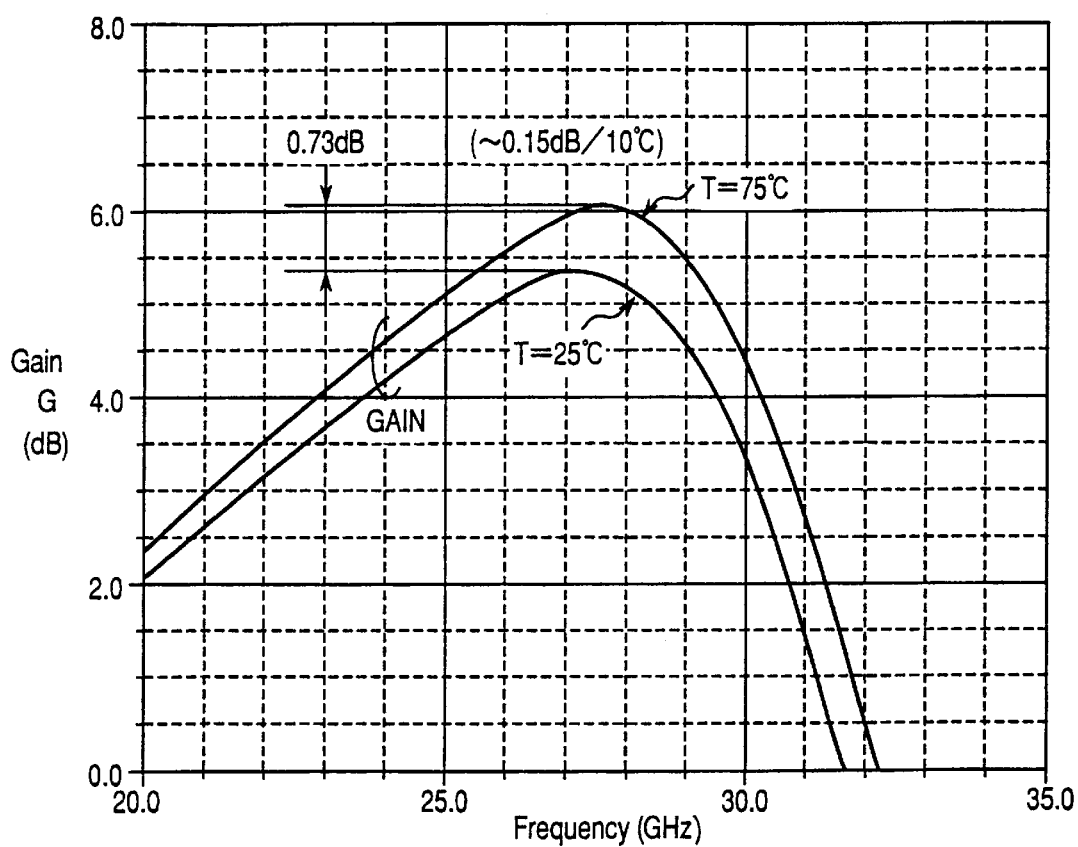
FIG. 5 is a graph of the change in gain relative to change in environmental temperature in an amplifier with a temperature compensation function according to the first embodiment of the present invention.

FIG. 5 is a graph showing simulation results using the measured S parameter values of active device 102 when T=25° C. and T=75° C. in the above amplifier 100 having a temperature compensation function. Gain (dB) is shown on the vertical axis, and frequency (GHz) is shown on the horizontal axis. With the amplifier 100 having a temperature compensation function according to the present invention, gain increases 0.73 dB when there is a 50 degree temperature gain from 25° C. to 75° C. This is opposite the temperature characteristic of a conventional amplifier, and proves that the circuit shown in FIG. 3B can compensate for the temperature characteristic of active device 101 without relying on external control.

Figure 6:
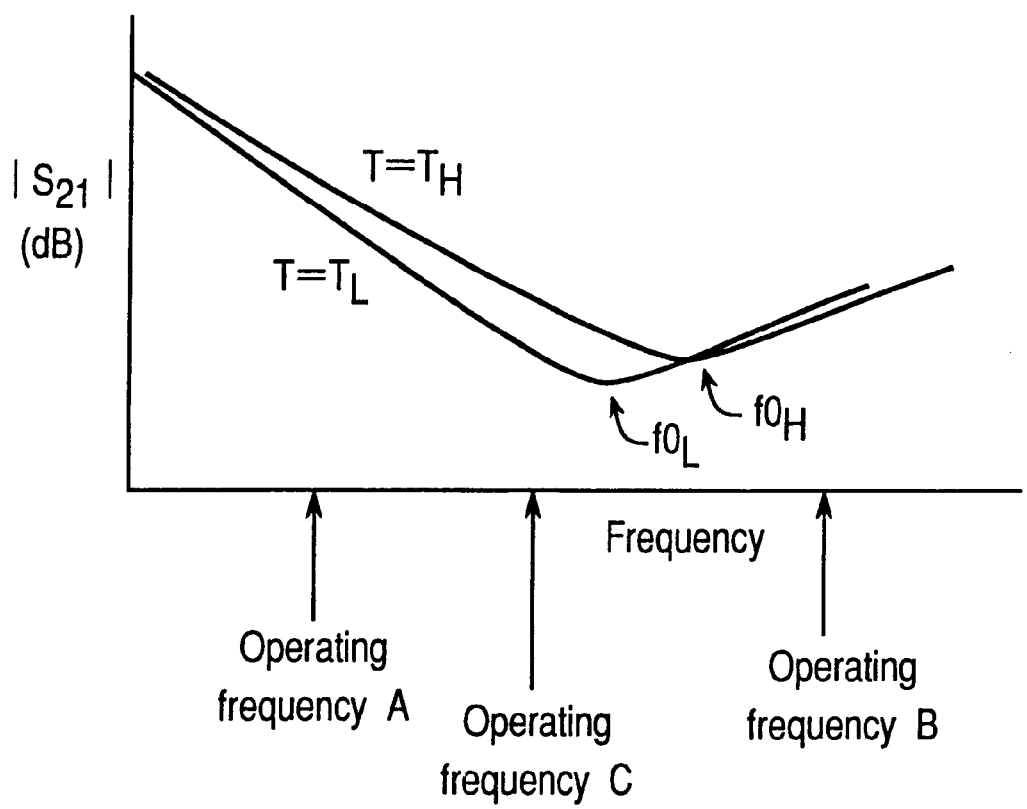
FIG. 6 is a graph of the frequency characteristic of a circuit functioning as an attenuation circuit.

FIG. 6 is a graph showing the frequency characteristic of the circuit shown in FIG. 3B and functioning as a high frequency signal attenuator in amplifier 100 when temperature T is $T_H$ and $T_L$. Frequency is shown on the horizontal axis, and the absolute value of the S21 parameter is shown on the vertical axis. Note that gain loss is lower at the upper end of this graph.

The attenuation frequency of the circuit functioning as an attenuator resonates according to the parasitic capacitance of active device 102 and the capacitance of capacitor 103. When the operating frequency of the circuit is below the resonance frequency f0 of the loss characteristic as shown at operating frequency A, loss decreases as temperature increases, and an appropriate temperature compensation effect is achieved. However, when the operating frequency is above the resonance frequency f0 as shown at operating frequency B, loss increases with a change in environmental temperature, and the change in gain accompanying a change in the environmental temperature of the amplifier 100 conversely increases.

It will also be known from this graph that temperature compensation is stronger at operating frequency C than at operating frequency A, and the resonance frequency shifts toward the high frequency side with an increase in environmental temperature due to the temperature characteristic of a parasitic component of active device 102.

It will be known from the above description that by setting the operating frequency of active device 102 to a frequency near operating frequency C in the graph shown in FIG. 6, that is, by setting the operating frequency of active device 102 to the highest possible frequency that is lower than the resonance frequency $F0_{Lmin}$ at the lowest usable operating temperature, the capacitance of capacitor 103 can be used to optimize the temperature compensation effect of an amplifier 100 according to the present invention.

As described above, an amplifier 100 with a temperature compensation function according to a first embodiment of the present invention suppresses temperature-induced fluctuations in the gain of the active device 101 used for amplification by means of an attenuation circuit, which similarly operates by means of temperature-induced changes in the resistance of an active device 102 used for temperature compensation. As a result, a temperature compensation function can be achieved using a simple circuit configuration without providing a separate control means specifically for temperature compensation.

Embodiment 2

An amplifier 120 with a temperature compensation function according to a second embodiment of the present invention is described next below with reference to FIG. 7, which is a circuit diagram thereof.

Note that like parts in an amplifier according to the present embodiment shown in this figure and the amplifier 100 shown in FIG. 1 are identified by like reference numbers, and further description thereof is omitted below.

Figure 7:
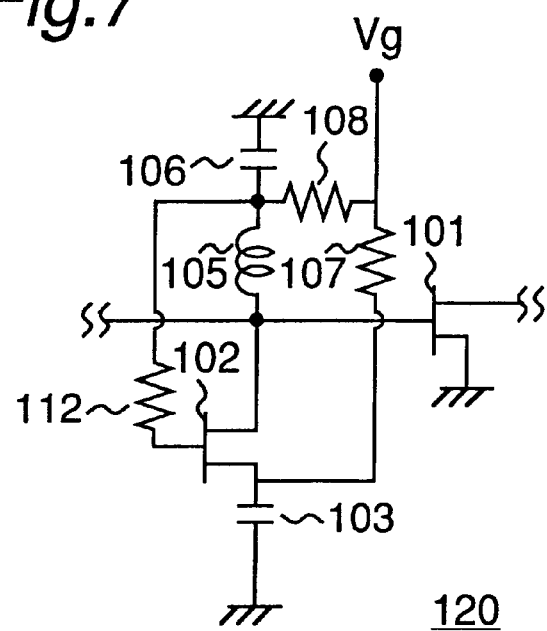
FIGS. 7 through 15 are circuit diagrams of amplifiers with a temperature compensation function according to the second through tenth embodiments, respectively, of the present invention.

As shown in FIG. 7, an amplifier 120 according to the present embodiment replaces resistor 104 in amplifier 100 according to the first embodiment with a resistor 112 connected between the gate of active device 102 for temperature compensation and the gate of active device 101 for amplification.

In this configuration the potential difference between the gate and source-drain electrodes of active device 102 is 0V irrespective of the drain current setting of active device 101. As a result, the resistance of active device 102 is constant. That is, high frequency signal loss below a base environmental temperature $T_o$ in the loss circuit is constant irrespective of the bias conditions under which active device 101 is used, and stable temperature compensation can therefore be achieved.

In addition, by connecting the gate terminals of active device 101 and active device 102 in common, connection to a ground external to the device is not necessary even with MMIC devices having no via holes. Note that said via holes are holes used for connecting terminals on the circuit board surface to a ground terminal disposed on the back side of the circuit board.

Embodiment 3

An amplifier 130 with a temperature compensation function according to a third embodiment of the present invention is described next below with reference to FIG. 8, which is a circuit diagram thereof.

Note that like parts in an amplifier according to the present embodiment shown in this figure and the amplifiers of the first and second embodiments are identified by like reference numbers, and further description thereof is omitted below.

Figure 8:
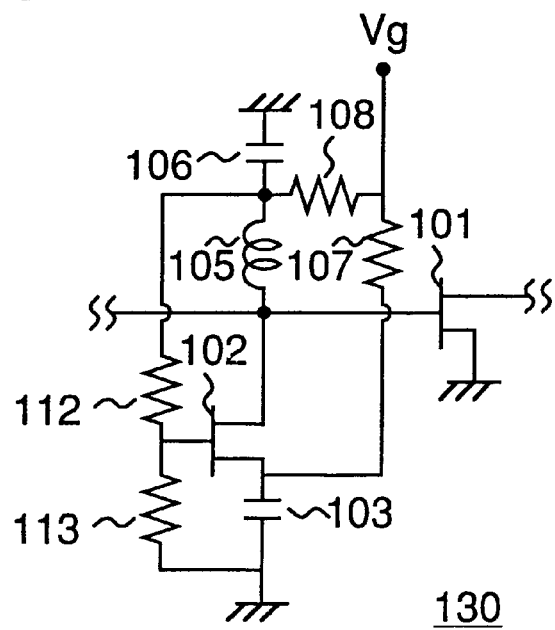

As shown in FIG. 8, an amplifier 130 according to the present embodiment further comprises a resistor 113 parallel connected to active device 102 of amplifier 120 according to the second embodiment with one terminal connected to the gate terminal of active device 102 and the other terminal to ground.

As previously described, the change in loss resulting from a change in the temperature of the loss circuit is dependent upon the resistance of active device 102 at $T=T_o$. When the gate potential of active device 101 is $V_g$, the gate potential $V_{gb}$ of active device 102 can be expressed as {resistance of resistor 113/(resistance of resistor 112+resistance of resistor 113)–1}×$V_g$.

By controlling the ratio between the resistance of resistor 112 and the resistance of resistor 113, the amplifier 130 can set the gate potential $V_{gb}$ of active device 102 in the range from 0 to $-V_g$. Experimental results have demonstrated that more appropriate temperature compensation can be achieved by appropriately setting the resistance of resistor 112 and resistor 113.

Embodiment 4

An amplifier 140 with a temperature compensation function according to a fourth embodiment of the present invention is described next below with reference to FIG. 9, which is a circuit diagram thereof.

Note that like parts in an amplifier according to the present embodiment shown in this figure and the amplifiers of the first through third embodiments are identified by like reference numbers, and further description thereof is omitted below.

Figure 9:
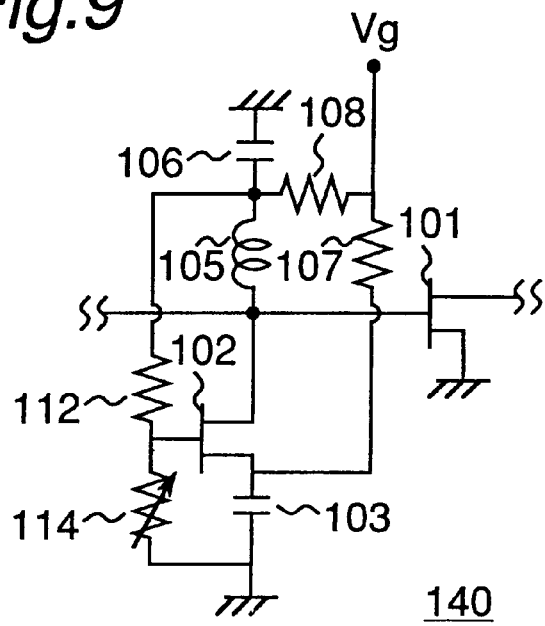

As shown in FIG. 9, an amplifier 140 according to the present embodiment further replaces resistor 113 of the amplifier 130 according to the third embodiment with a variable resistor 114 parallel connected to active device 102 of amplifier 120 according to the second embodiment with one terminal connected to the gate terminal of active device 102 and the other terminal to ground.

When the gate potential of active device 101 is $V_g$, the gate potential $V_{gb}$ of active device 102 in this embodiment can be expressed as {resistance of resistor 114/(resistance of resistor 112+resistance of resistor 114)–1}×$V_g$.

In general, $V_g$ is variable within a certain range due to manufacturing variations even when the drive current setting of active device 101 is constant. This causes the gain to also vary. With amplifier 140 according to the present embodiment, however, the potential difference between the gate and source-drain electrodes of active device 102 can be controlled by means of variable resistor 114, and differences introduced during production of the active device 101 can thereby be absorbed.

It should be noted that the amplifier 140 according to the present embodiment achieves a temperature compensation function by using the temperature-induced change in the resistance of active device 102, that is, by means of the same mechanism used in the amplifiers with a temperature compensation function according to the first through third embodiments above. As a result, a separate specific control circuit is not needed, and a temperature compensation function can be achieved by means of a simple circuit configuration.

Embodiment 5

An amplifier 150 with a temperature compensation function according to a fifth embodiment of the present invention is described next below with reference to FIG. 10, which is a circuit diagram thereof.

Note that like parts in an amplifier according to the present embodiment shown in this figure and the amplifiers of the first through fourth embodiments are identified by like reference numbers, and further description thereof is omitted below.

Figure 10:
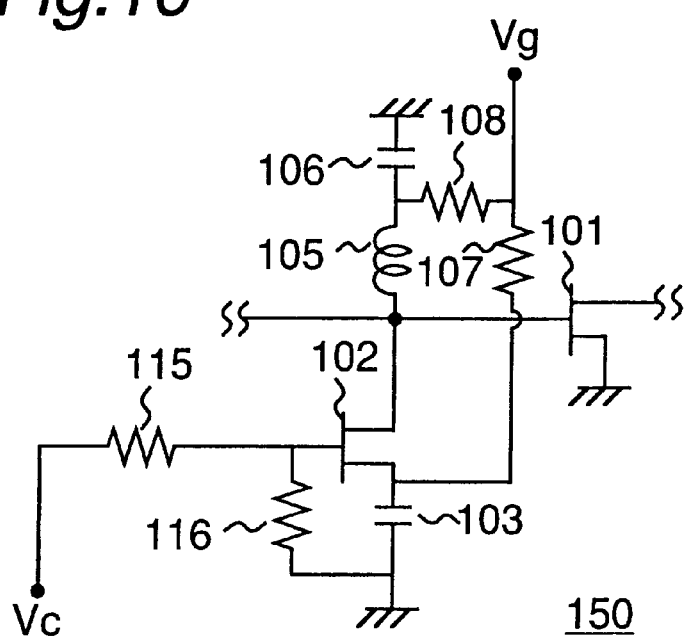

As shown in FIG. 10, an amplifier 150 according to the present embodiment comprises a resistor 115 serially connected between a power supply terminal and the gate terminal of active device active device 102 in amplifier 100 according to the first embodiment, and a resistor 116 parallel connected to ground and the gate of active device 102. Gate potential $V_c$ is thus supplied from an external power source via the power supply terminal.

When the gate potential of active device 101 is $V_g$ in this configuration, the gate potential $V_{gb}$ of active device 102 in this embodiment can be expressed as the resistance of resistor 116/(resistance of resistor 115+resistance of resistor 116)$\times V_c - V_g$.

In this circuit, therefore, the potential difference between the gate terminal and the source-drain electrodes of active device 102 is controlled by means of an external power source. An amplifier 150 according to the present embodiment therefore requires a separate external power source, but does not require a separate specific control circuit for temperature compensation of gain, and a temperature compensation function can therefore be achieved by means of a simple circuit configuration.

Embodiment 6

An amplifier 160 with a temperature compensation function according to a sixth embodiment of the present invention is described next below with reference to FIG. 11, which is a circuit diagram thereof.

Note that like parts in an amplifier according to the present embodiment shown in this figure and the amplifiers of the first through fifth embodiments are identified by like reference numbers, and further description thereof is omitted below.

Figure 11:
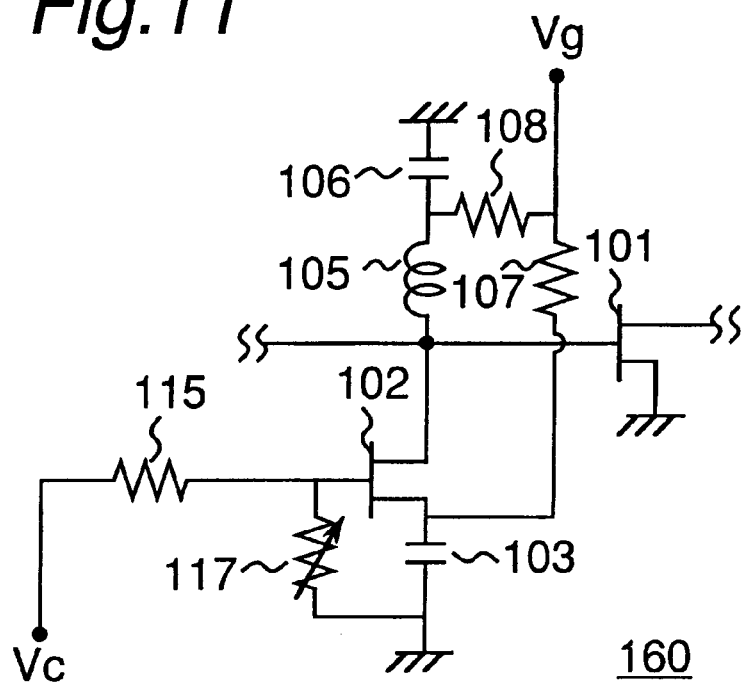

As shown in FIG. 11, an amplifier 160 according to the present embodiment replaces the resistor 116 in an amplifier 150 according to the fifth embodiment with a variable resistor 117 parallel connected to the gate of active device 102. Gate potential $V_c$ is thus supplied from an external power source via the power supply terminal.

When the gate potential of active device 101 is $V_g$ in this configuration, the gate potential $V_{gb}$ of active device 102 in this embodiment can be expressed as the resistance of resistor 117/(resistance of resistor 115+resistance of resistor 117)$\times V_c - V_g$.

In this circuit, therefore, the potential difference between the gate terminal and the source-drain electrodes of active device 102 is controlled by means of an external power source. As noted above, amplifier 150 according to the fifth embodiment requires a separate external power source, but does not require a separate specific control circuit for temperature compensation. With amplifier 160 according to the present embodiment, however, the potential difference between the gate and source-drain electrodes of active device 102 can be controlled by means of variable resistor 117, and differences introduced by the manufacturing process of the active device 101 can thereby be absorbed.

Embodiment 7

An amplifier 170 with a temperature compensation function according to a seventh embodiment of the present invention is described next below with reference to FIG. 12, which is a circuit diagram thereof.

Note that like parts in an amplifier according to the present embodiment shown in this figure and the amplifiers of the first through sixth embodiments are identified by like reference numbers, and further description thereof is omitted below.

Figure 12:
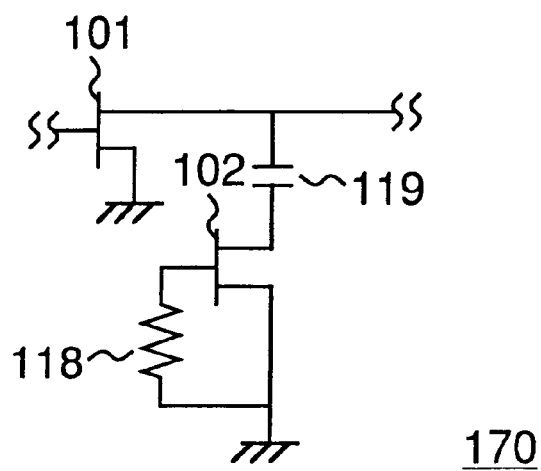

As shown in FIG. 12, an amplifier 170 according to the present embodiment disposes a circuit achieving the temperature compensation function serially to the signal output terminal of the active device 101 for amplification. This circuit achieving the temperature compensation function comprises active device 102, resistor 118, and capacitor 119, and functions as a high frequency signal attenuator. Note that the gate of active device 102 is connected to ground through resistor 118, and the drain electrode of active device 102 is also connected to ground.

As noted above, the circuit achieving the temperature compensation function operates as an attenuator. By increasing high frequency signal loss in the temperature compensation circuit when the gain of the active device 101 for amplification rises accompanying a drop in environmental temperature, the high frequency signal output from the amplifier 170 can be held at a constant level.

It should be noted that a circuit achieving a temperature compensation function shall not be limited to the configuration shown in FIG. 12, and any configuration described in the second through sixth embodiments above can be specifically used.

Embodiment 8

An amplifier 200 with a temperature compensation function according to an eighth embodiment of the present invention is described next below with reference to FIG. 13, which is a block diagram thereof.

Note that like parts in an amplifier according to the present embodiment shown in this figure and the amplifiers of the first through seventh embodiments are identified by like reference numbers, and further description thereof is omitted below.

Figure 13:
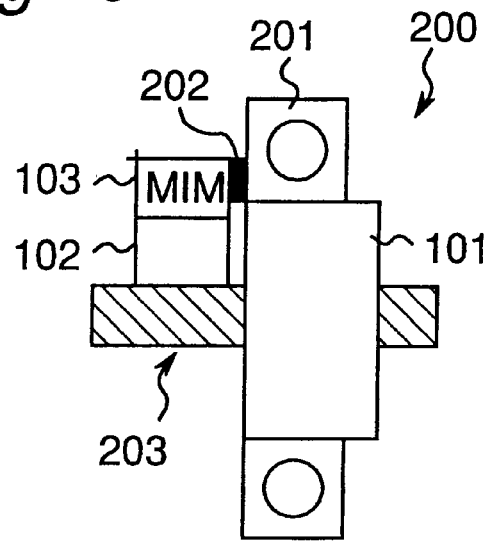

As shown in FIG. 13, an amplifier 200 according to the present embodiment is an amplifier 100 according to the first embodiment where the source or drain terminal of the active device 102 for temperature compensation is connected via capacitor 103 and interconnect 202 to a via hole 201 used for grounding the source terminal of an active device 101 for amplification formed on main line 203. It should be noted that capacitor 103 is shown as a metal-insulator-metal (MIM) device in the layout diagram in FIG. 13. Note, further, that devices other than active device 101, active device 102, and capacitor 103, for example, inductor 105 and resistors 107 and 108, have been omitted from FIG. 13 for convenience only.

Device size reduction can also be promoted with an amplifier 200 according to the present embodiment by adopting a layout in which a common via hole is used to ground both active devices 101 and 102. In addition, by disposing active devices 101 and 102 in proximity, they can be treated as a single device during design, thereby making such design work as design parameter evaluation easier than before.

Embodiment 9

An amplifier 210 with a temperature compensation function according to a ninth embodiment of the present invention is described next below with reference to FIG. 14, which is a block diagram thereof.

Note that like parts in an amplifier according to the present embodiment shown in this figure and the amplifiers of the first through eighth embodiments are identified by like reference numbers, and further description thereof is omitted below.

Figure 14:
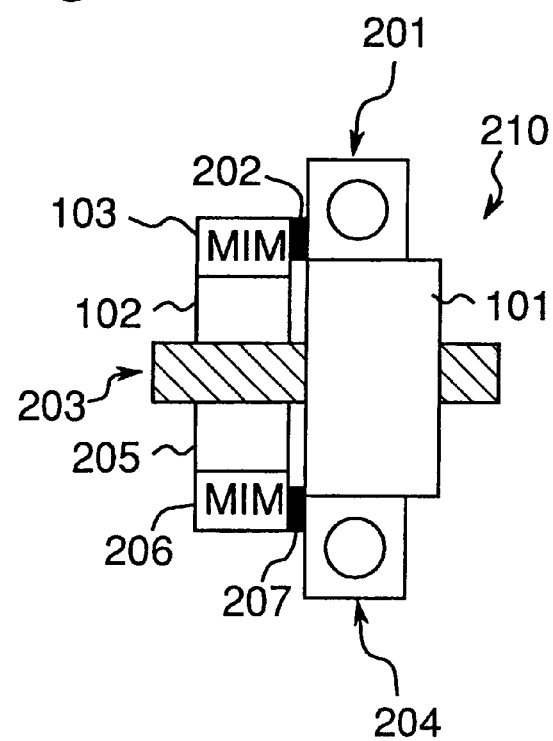

As shown in FIG. 14, an amplifier 210 according to the present embodiment is an amplifier 200 according to the eighth embodiment further comprising an active device 205 for temperature compensation arranged symmetrically to active device 102 on an opposing side of the main line 204. As with the active device 102 for temperature compensation, the source or drain terminal of active device 205 for temperature compensation is connected via capacitor 206 and interconnect 207 to a via hole 204 of amplification active device 101.

Device size reduction can also be promoted with an amplifier 210 according to the present embodiment by adopting a layout in which active devices 102 and 205 are grounded using via holes 201 and 204 of active device 101.

In addition, by disposing two active devices 102 and 205 for temperature compensation on opposite sides of main line 203, the temperature compensation effect of an amplifier 210 according to the present embodiment is improved, and unbalanced operation at the input terminal of the active device 101 for amplification can be eliminated in the millimeterwave region.

Embodiment 10

Figure 15:
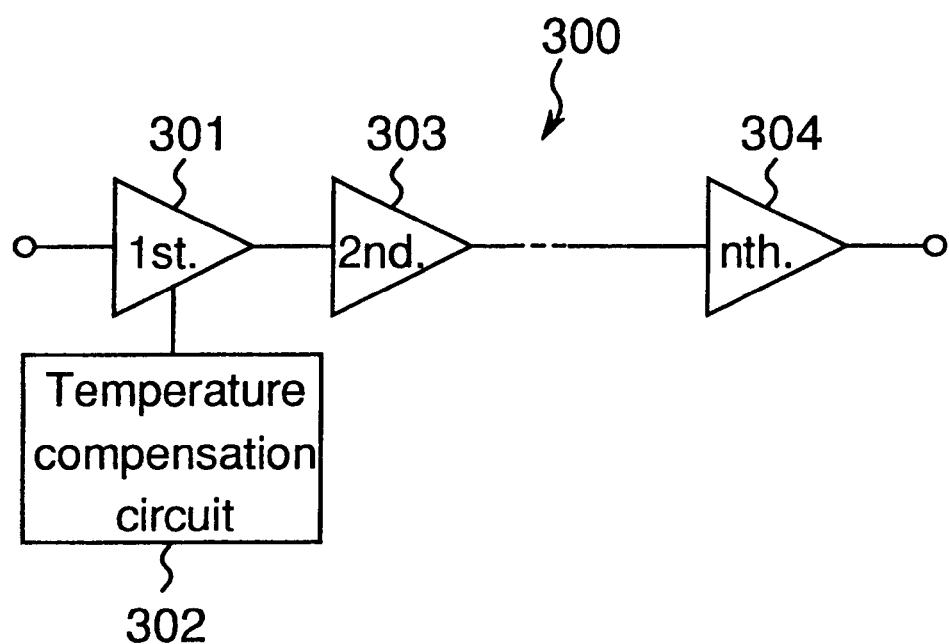

A multistage power amplification apparatus 300 according to a tenth embodiment of the present invention is described next below with reference to FIG. 15.

Note that an amplification apparatus 300 according to the present embodiment comprises a temperature compensation circuit as shown in any of the first through eighth embodiments above in at least the first stage amplifier, that is, comprises a circuit functioning as a high frequency signal attenuator serially connected to the amplification apparatus 300. An amplification apparatus 300 according to the present embodiment is particularly advantageous in such cases as when a temperature compensation circuit cannot be added to each stage due, for example, to device size limitations, when specifications do not require the addition of such a temperature compensation circuit to each stage, or when the amplitude of the input high frequency signal is low and there is sufficient tolerance in the power connection to the next downstream amplifier.

As described hereinabove, an amplifier with a temperature compensation function according to any of the first through tenth embodiments of the present invention does not require an external power source to bias a gate terminal, that is, the gain control terminal, of an active device for amplification. It is furthermore not necessary with said amplifier to premeasure the temperature characteristic of amplifier gain to determine the bias required at a given temperature, and a mechanism for applying this control information during actual amplifier operation need not be separately provided in the system or module.

Furthermore, amplifiers according to the present invention can be formed on a wafer (chip) using simple process control because the active devices have the same response characteristics to temperature change.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An amplifier circuit for amplifying high frequency signals comprising:
    an amplifier comprising a first active device for amplifying a high frequency signal; and
    an attenuation circuit comprising a second active device for attenuating the high frequency signal input to said amplifier, wherein said attenuation circuit varies attenuation of the high frequency signal input to said amplifier depending on changes in temperature of said amplifier circuit and changes in gain of said second active device due to changes in temperature of said amplifier circuit, thereby compensating temperature drift of said amplifier.

2. The amplifier circuit of claim 1, wherein said first active device has a gate, and said second active device has a grounded gate, a drain grounded via a capacitor, and a source connected to the gate of said first active device.

3. The amplifier circuit of claim 2, wherein the gate of said second active device is grounded via a first resistor.

4. The amplifier circuit of claim 3, wherein said first resistor is a variable resistor.

5. The amplifier circuit of claim 3, wherein the gate of said second active device is connected to a power supplying terminal via a second resistor.

6. The amplifier circuit of claim 1, wherein said first active device has a gate, and said second active device has a gate connected to the gate of said first active device via a first resistor, a drain grounded via a capacitor, and a source connected to the gate of said first active device.

7. The amplifier circuit of claim 6, wherein the gate of said second active device is connected to the ground via a second resistor.

8. The amplifier circuit of claim 7, wherein said second resistor is a variable resistor.

9. A multi-stage amplifier comprising:
    a plurality of amplifiers connected in series in which at least a first stage amplifier comprises a first active device for amplifying a high frequency signal; and
    an attenuation circuit comprising a second active device for attenuating the high frequency signal input to said first active device, said attenuation circuit varying attenuation of the high frequency signal depending on changes in temperature of said amplifier and changes in gain of said second active device due to changes in temperature of said amplifier, thereby compensating temperature drift of said first stage amplifier.

* * * * *